United States Patent
Namekawa

(10) Patent No.: US 9,819,312 B2
(45) Date of Patent: Nov. 14, 2017

(54) VEHICULAR AUDIO-AMPLIFIER CONTROLLER

(71) Applicant: DENSO CORPORATION, Kariya, Aichi-pref. (JP)

(72) Inventor: Daisuke Namekawa, Kariya (JP)

(73) Assignee: DENSO CORPORATION, Kariya, Aichi (JP)

( * ) Notice: Subject to any disclaimer, the term of this patent is extended or adjusted under 35 U.S.C. 154(b) by 0 days.

(21) Appl. No.: 15/106,979

(22) PCT Filed: Dec. 11, 2014

(86) PCT No.: PCT/JP2014/006170
§ 371 (c)(1),
(2) Date: Jun. 21, 2016

(87) PCT Pub. No.: WO2015/098014
PCT Pub. Date: Jul. 2, 2015

(65) Prior Publication Data
US 2016/0373070 A1     Dec. 22, 2016

(30) Foreign Application Priority Data
Dec. 24, 2013   (JP) .................................. 2013-265460

(51) Int. Cl.
| | |
|---|---|
| H04B 1/00 | (2006.01) |
| H03F 1/02 | (2006.01) |
| H03F 3/181 | (2006.01) |
| H03F 3/68 | (2006.01) |
| H03F 3/20 | (2006.01) |
| H04R 3/12 | (2006.01) |

(52) U.S. Cl.
CPC .......... H03F 1/0227 (2013.01); H03F 3/181 (2013.01); H03F 3/20 (2013.01); H03F 3/68 (2013.01); H04R 3/12 (2013.01); *H04R 2499/13* (2013.01)

(58) Field of Classification Search
USPC .... 381/58, 86, 89, 71.4, 120, 150, 302, 365, 381/389
See application file for complete search history.

(56) References Cited

U.S. PATENT DOCUMENTS

| | | | |
|---|---|---|---|
| 7,576,445 B2* | 8/2009 | Hammerschmidt | G05F 1/56 180/282 |
| 2013/0034250 A1* | 2/2013 | Ozaki | H03F 1/3205 381/120 |

FOREIGN PATENT DOCUMENTS

WO    WO-2011142139 A1    11/2011

* cited by examiner

*Primary Examiner* — Yosef K Laekemariam
(74) *Attorney, Agent, or Firm* — Harness, Dickey & Pierce, P.L.C.

(57) ABSTRACT

A vehicular audio-amplifier controller includes: a delay buffer that stores a sound signal supplied from a signal source; a first processing unit that applies an absolute value process to the supplied sound signal; a second processing unit that applies a low-pass filter process and an offset process to a processing result of the first processing unit; a power supply controller that performs control to change a voltage value of a vehicular power supply according to at least a signal value processed by the second processing unit and a type of the signal source; and a sound signal output unit that outputs a sound signal stored in the delay buffer with only a delay time that is determined based on a power supply control process time of the power supply controller.

5 Claims, 6 Drawing Sheets

VEHICULAR AUDIO-AMPLIFIER CONTROLLER

CROSS REFERENCE TO RELATED APPLICATIONS

This application is a U.S. National Phase Application under 35 U.S.C. 371 of International Application No. PCT/JP2014/006170 filed on Dec. 11, 2014 and published in Japanese as WO 2015/098014 A1 on Jul. 2, 2015. This application is based on and claims the benefit of priority from Japanese Patent Applications No. 2013-265460 filed on Dec. 24, 2013. The entire disclosures of all of the above applications are incorporated herein by reference.

TECHNICAL FIELD

The present disclosure relates to a vehicular audio-amplifier controller.

BACKGROUND ART

A conventional vehicular audio-amplifier controller includes a control circuit such as a digital signal processor (DSP) or a central processing unit (CPU) and is supplied with sound signals from various input sources. The control circuit outputs a sound signal to an audio amplifier. The audio amplifier amplifies the sound signal and outputs a sound via a speaker installed in a vehicle (e.g., see patent literature 1).

It is favorable to decrease power consumption of a vehicular power supply in a vehicle (particularly a hybrid car or an electric car) as much as possible. The power efficiency can be increased by decreasing a power-supply voltage of the vehicular power supply as much as possible.

For example, control over detecting an input signal and changing a power-supply voltage of the audio amplifier may use a technology that changes the power-supply voltage in anticipation of a margin voltage as security against a sudden change in the input signal. This type of technology can compute a tendency of input signals and use a result for control processing so as to minimize the margin and improve the efficiency, but leaves room for improvement of the power efficiency.

PRIOR ART LITERATURES

Patent Literature

Patent Literature 1: WO2011/142139

SUMMARY OF INVENTION

It is an object of the present disclosure to provide a vehicular audio-amplifier controller capable of responding to a sudden change in an input signal as much as possible, suppressing a distortion as much as possible, and increasing power efficiency of a vehicular power supply.

A vehicular audio-amplifier controller in an aspect of the present disclosure includes a delay buffer, a first processing unit, a second processing unit, a power supply controller, and a sound signal output unit. The delay buffer stores a sound signal supplied from a signal source. The first processing unit applies an absolute value process to the supplied sound signal. The second processing unit applies a low-pass filter process and an offset process to a processing result of the first processing unit. The power supply controller performs control to change a voltage value of a vehicular power supply at least in accordance with a signal value processed by the second processing unit and a type of the signal source. The sound signal output unit outputs the sound signal stored in the delay buffer with only a delay time that is determined based on a power supply control process time of the power supply controller.

The vehicular audio-amplifier controller can appropriately adjust the power-supply voltage according to the signal source, save the power consumption, and improve the power efficiency of the vehicular power supply. Moreover, because the sound signal output unit outputs the sound signal stored in the delay buffer with the delay time that is determined dependent on the power supply control process time, the vehicular audio-amplifier controller can respond to a sudden change in the input signal and suppress a distortion.

BRIEF DESCRIPTION OF DRAWINGS

The foregoing and other objects, configurations, and advantages of the present disclosure will become more apparent from the below-described detailed description made with reference to the accompanying drawings in which.

EMBODIMENTS FOR CARRYING OUT INVENTION

Embodiments of a vehicular audio-amplifier controller will be described.

(First Embodiment)

Figure 1:
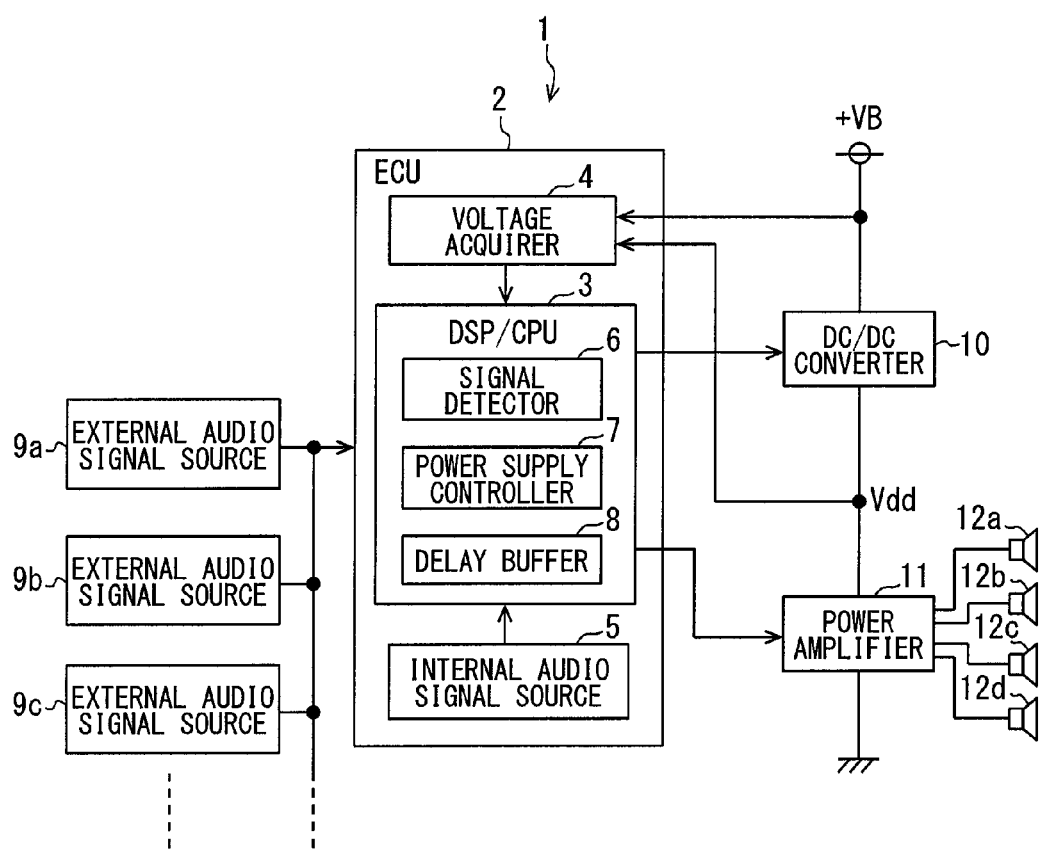
FIG. 1 is a block diagram schematically illustrating an electric configuration of a vehicular audio-amplifier controller according to a first embodiment of the present disclosure.

The first embodiment of the present disclosure will be described with reference to FIGS. 1 through 6. FIG. 1 is a block diagram schematically illustrating an electric configuration inside a vehicular audio amplifier in a vehicle.

A vehicular audio-amplifier controller 1 is mainly configured as an electronic control unit (ECU) 2. The electronic control unit 2 includes a DSP and/or a CPU (hereinafter referred to as a control circuit) 3. The electronic controller 2 further includes a voltage acquisition unit 4 and an internal audio signal source 5.

The control circuit 3 operates based on software stored in the control circuit 3 or in an external memory device. The control circuit 3 includes functions acting as a signal detector 6, a power supply controller 7, and a delay buffer 8. To an outside, the electronic control unit 2 supplies sound signals which are from various external audio signal sources 9a through 9c.

The external audio signal sources 9a through 9c supply signals for terrestrial digital broadcasting (full-segment and one-segment), DVD, CD, emergency notification, FM broadcast, and AM broadcast. The signal sources 9a through 9c are generated from various onboard audio sources (unshown). The electronic control unit 2 includes a dedicated module (unshown) to generate or store an electronic sound as the internal audio signal source 5 such as an indicator sound for a turn signal lamp (unshown) or beep sounds for various alarms (e.g., speed alarm). The electronic sound is generated at a specified frequency or a combination of specified frequencies. The internal audio signal source 5 is stored as sound information in an unshown memory device.

The indicator sound is conventionally generated as a click sound when an energization relay switch for a turn signal lamp turns on and off. This sound is unavailable when the turn signal lamp is turned on and off under electronic control. Thus, no indicator sound may give uncomfortable feeling to a vehicle user (driver) who is used to drive a vehicle that uses the relay switches. It may be preferable to electronically generate an artificial indicator sound. In such a case, the electronic control unit 2 pre-stores the indicator sound as the internal audio signal source 5 and generates the indicator sound in the vehicle compartment. The electronic control unit 2 may be integrated with part (e.g., terrestrial digital broadcasting) of the functions of the external audio signal sources 9a through 9c.

The signal detector 6 in the control circuit 3 is supplied with a sound signal from the internal and external audio signal sources 5 and 9a through 9c and samples the sound signal. The control circuit 3 stores the sound signal as a digital signal in the delay buffer 8. For delayed output, the delay buffer 8 temporarily stores the sound signals of the internal and external audio signal sources 5 and 9a through 9c.

A DC/DC converter 10, a power amplifier 11 acting as an audio amplifier, and speakers 12a through 12d are provided inside the vehicle. The DC/DC converter 10 is supplied with battery voltage +VB, DC-DC converts the voltage under control of the control circuit 3 in real time, and supplies direct current voltage Vdd to the power amplifier 11. The power amplifier 11 is supplied with power-supply voltage Vdd output from the DC/DC converter 10 and operates on power-supply voltage Vdd.

The voltage acquisition unit 4 is provided inside the electronic control unit 2. The voltage acquisition unit 4 acquires battery voltage +VB as an original power-supply voltage and assumes battery voltage +VB to be a power-supply voltage value. The voltage acquisition unit 4 also acquires power-supply voltage Vdd output from the DC/DC converter 10. The voltage acquisition unit 4 successively outputs information on these voltages to the control circuit 3. The power supply control unit 7 of the control circuit 3 controls power-supply voltage Vdd output from the DC/DC converter 10 based on values of battery voltage +VB and direct current voltage Vdd acquired by the voltage acquisition unit 4 to adjust the output power-supply voltage Vdd. The control circuit 3 transmits the sound signal stored in the delay buffer 8 to the power amplifier 11. The power amplifier 11 thereby amplifies the sound signal to output the sound from the speakers 12a through 12d.

A feature of the embodiment is that that the control circuit 3 controls and adjusts power-supply voltage Vdd of the power amplifier 11 based on the contents of the audio signal sources 5, 9a through 9c to control and adjust the maximum output of the sound signal. The description below explains this point in detail.

Figure 2:
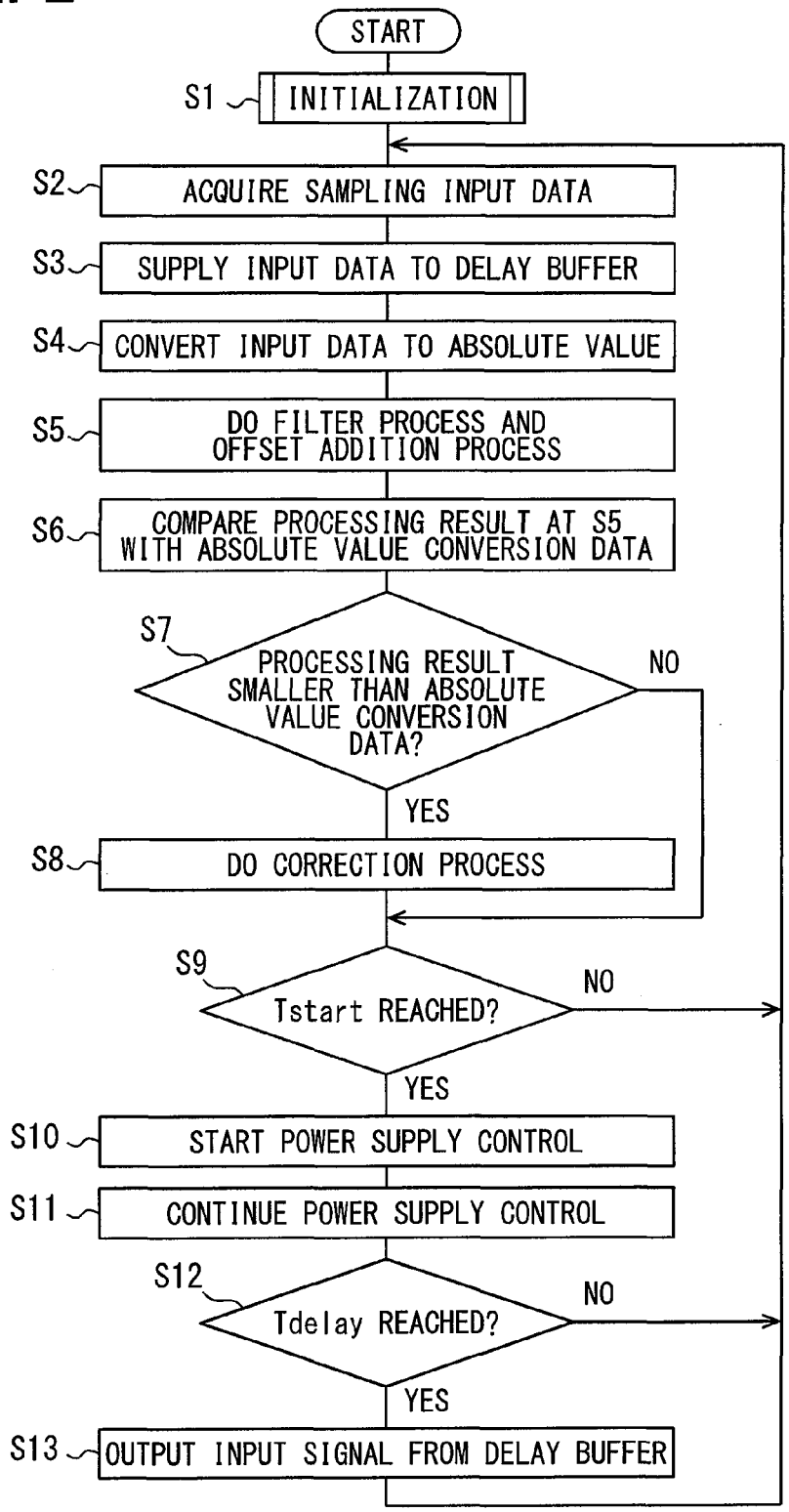
FIG. 2 is a flowchart schematically illustrating a flow of a power supply control process.
Figure 3:
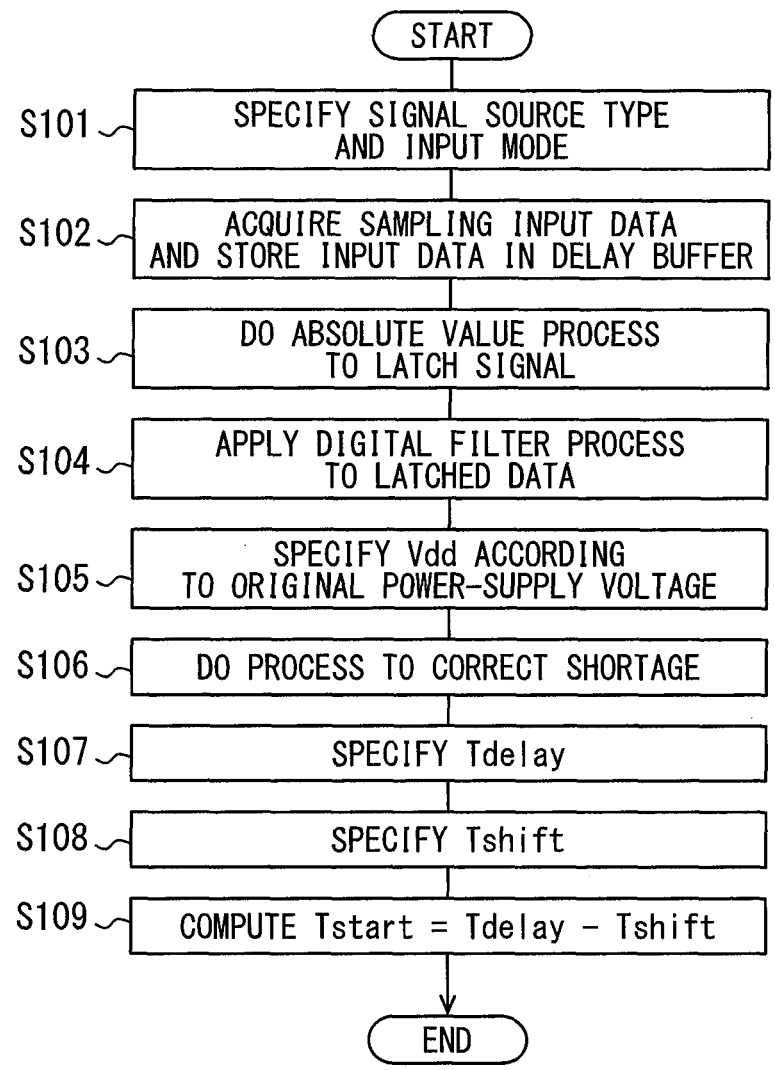
FIG. 3 is a flowchart schematically illustrating a flow of the initialization in FIG. 2.
Figure 4:
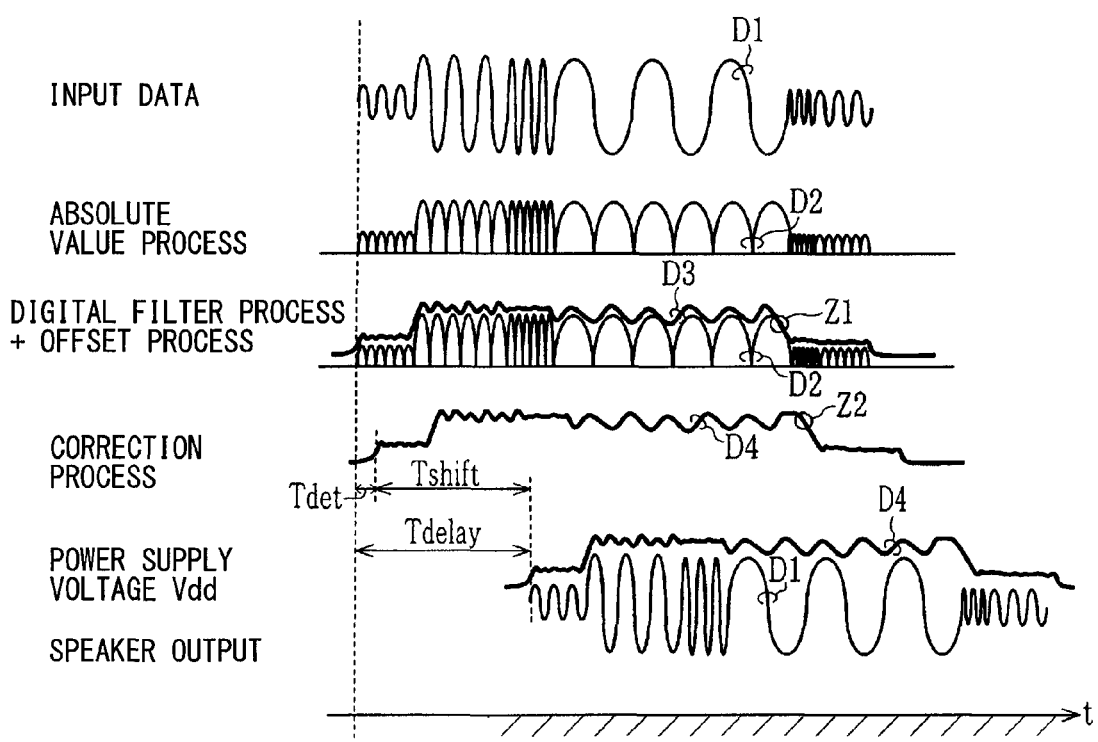
FIG. 4 is a waveform diagram schematically illustrating a flow of the power supply control process.
Figure 5A:
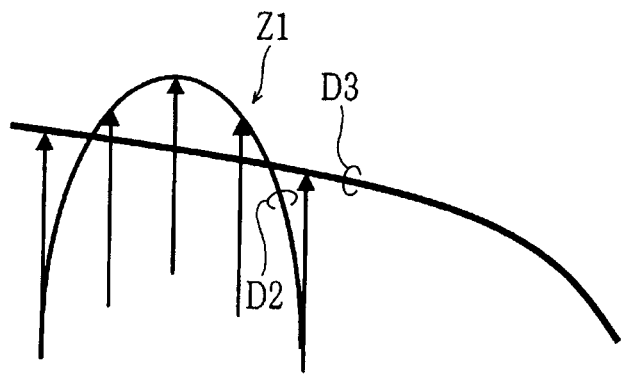
FIG. 5A is a diagram illustrating control data before correction.
Figure 5B:
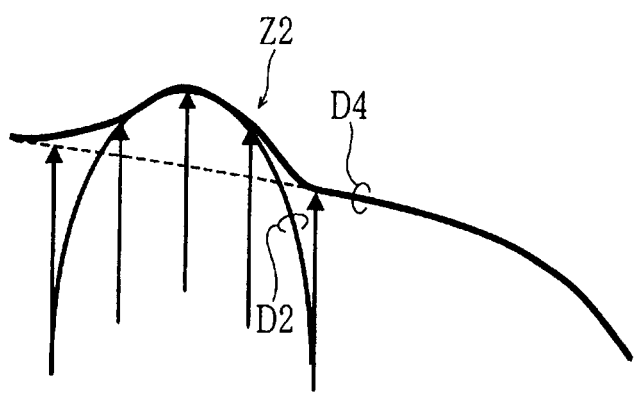
FIG. 5B is a diagram illustrating control data after correction.
Figure 6:
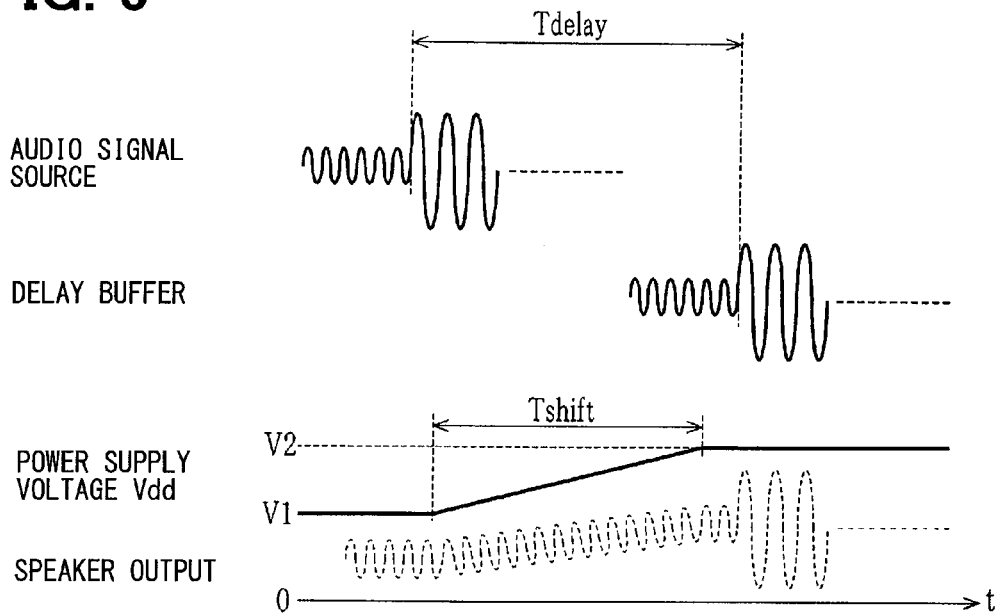
FIG. 6 is a waveform diagram schematically illustrating a flow of part of the power supply control process.

FIGS. 2 and 3 are flowcharts schematically illustrating operations of the vehicular audio-amplifier controller 1. FIGS. 4 through 6 are timing diagrams schematically illustrating operations of the vehicular audio-amplifier controller 1.

For example, suppose the speakers 12a through 12d are provided as vehicular instruments and are connected based on a bridged transless (BTL) technique using output impedance 4Ω. Theoretically, the distortionless maximum output is 18 [W] under the condition of power-supply voltage Vdd=12 [V]. The distortionless maximum output is 25.9 [W] under the condition of power-supply voltage Vdd=14.4 [V]. The distortionless maximum output is 10.1 [W] under the condition of power-supply voltage Vdd=9 [V]. The distortionless maximum output is 5.3 [W] under the condition of power-supply voltage Vdd=6.5 [V]. Namely, the maximum output increases with increasing power-supply voltage Vdd. The maximum output decreases with decreasing power-supply voltage Vdd.

The present embodiment takes into account these characteristics. The control circuit 3 identifies the signal sources 5, 9a through 9c and performs control to change power-supply voltage Vdd based on the types of the signal sources 5, 9a through 9c so that no sound signal clip occurs. The control circuit 3 performs control to change power-supply voltage Vdd based on successively varying battery voltage +VB so that no sound signal clip occurs.

For example, the control circuit 3 performs a process in FIG. 2. As illustrated in FIG. 2, the control circuit 3 performs initialization in FIG. 3 (S1 in FIG. 2). FIG. 3 schematically illustrates a flow of the initialization. As illustrated in FIG. 3, the control circuit 3 specifies the type and the input mode of a signal source (S101 in FIG. 3). The control circuit 3 determines which signal source is used and which input mode is used, based on mode management information stored in an internal memory device (unshown).

The mode management information indicates input signal source types, sound signal input modes, and the like. The control circuit 3 references the mode management information to determine which of the external audio signal sources 9a through 9c and the internal audio signal source 5 is used, for example. The mode management information also contains sound output modes.

For example, the control circuit 3 can identify the signal source type such as terrestrial digital broadcasting, DVD, CD, AM radio, or FM radio. The control circuit 3 can also identify normal broadcast or an emergency warning system in the signal sources. The terrestrial digital broadcasting may contain emergency warning information. In this case, an externally connected receiver (unshown) detects the contents of the emergency warning system (EWS). This information is registered to the mode management information. A system in Europe such as the radio data system (RDS) can be detected similarly. The detected information is registered to the mode management information.

The control circuit 3 references the mode management information to determine whether the normal broadcast or the emergency warning system is used. Further, the external audio signal sources 9a through 9c can be identified by detecting connection to or disconnection from different input ports as a hardware requirement. The identification is not limited to the above-mentioned method.

A dedicated module (unshown) in the electronic control unit 2 may provide control to generate an indicator sound or a beep sound as the internal audio signal source 5. In such a case, the dedicated module transmits this notification to the control circuit 3. The control circuit 3 can thereby identify the time to generate an artificial indicator sound (e.g., synchronously with flashing of a hazard warning flashing lamp) or a beep sound. The control circuit 3 centrally manages these sequences of operations and detection processes.

Only for a specified time period, the control circuit 3 accumulates and stores in the delay buffer 8 a signal from the internal and external audio signal sources 5 and 9a through 9c based on a first-in first-out (FIFO) technique (S102 in FIG. 3: see input data D1 in FIG. 4). The control circuit 3 applies an absolute value process (S103 in FIG. 3: see data D2 of absolute value process in FIG. 4) to the signal stored in the delay buffer 8 and latches the processed signal. The control circuit 3 applies a digital filter (low-pass filter) process to the latched data (S104 in FIG. 3: see digital filter process+offset process in FIG. 4). The control circuit 3 adds or subtracts an offset to or from the result of the digital filter process.

The control circuit 3 specifies maximum output power-supply voltage Vdd according to an acquired voltage value of battery voltage +VB (original power-supply voltage) acquired by the voltage acquisition unit 4 (S105 in FIG. 3). As control data D3 for maximum output power-supply voltage Vdd, the control circuit 3 specifies a value processed in the absolute value process at S103 and the digital filter process at S140 and added to the offset value (e.g., a specified value exceeding 0).

The waveform diagram for digital filter process+offset process in FIG. 4 also contains control data D3 for power-supply voltage Vdd resulting from input data to which the digital filter process and the offset process are applied. This voltage Vdd is processed so as to generally cover data D2 because harmonic components in the input data are filtered and an offset (direct current) is added.

Actually, however, the use of this process only may cause part of data D3 for power-supply voltage Vdd to be not greater than or equal to absolute value data D2 of the input data. In such a case, the control circuit 3 performs a process to correct a shortage of the maximum output voltage (S106 in FIG. 3). FIG. 5A illustrates control data D3 before the correction corresponding to targeted portion Z1. FIG. 5B illustrates control data D4 after the correction corresponding to targeted portion Z2. As illustrated in FIG. 5A, control data D3 for power-supply voltage Vdd partially goes below the peak of the absolute value process applied data D2. The control circuit 3 corrects control data D3 for power-supply voltage Vdd at sampling intervals (time points indicated by arrows in FIGS. 5A and 5B) so that control data D3 becomes greater than or equal to absolute value data D2. The corrected control data D3 is used as control data D4 after the correction.

The control circuit 3 specifies delay time Tdelay (S107 in FIG. 3) and power supply transition time Tshift (S108 in FIG. 3). The control circuit 3 computes power supply control start time Tstart=delay time Tdelay−power supply transition time Tshift (S109 in FIG. 3). This delay time Tdelay needs to be appropriately configured to ensure the time sufficient for necessary processes in terms of a system configuration.

As a principle diagram in FIG. 6 illustrates, power-supply voltage Vdd varies, for example, linearly from initial voltage V1 to target voltage (settle voltage) V2 after the power supply control process is performed. Thus, it may be preferable that the control circuit 3 compute a power supply fluctuation range in which power-supply voltage Vdd is changeable in the delay time Tdelay, and that the control circuit 3 pre-compute delay time Tdelay corresponding to the maximum power supply fluctuation range. Alternatively, it may be preferable to previously compute a minimum value of the delay time Tdelay that meets this condition. This can prevent a clip (i.e., input data D1 exceeds power-supply voltage Vdd to cause a distortion) as much as possible.

The above computation is performed because, if the power supply is controlled in response to an input signal, an actual power supply control process requires time to achieve target voltage (recovery voltage) V2. In consideration of this, the delay time may be settled appropriately according to the types of the signal sources 5, 9a through 9c. This is because different types of the signal sources 5, 9a through 9c require different voltage fluctuation ranges of the power-supply voltage Vdd. Accordingly, delay time Tdelay can differ from each other. There has been described the initialization at S1 in FIG. 2.

As illustrated in FIG. 2, the control circuit 3 subsequently performs the power supply control process in real time (S2 through S13). During the real-time process, the control circuit 3 acquires sampling input data (S2 in FIG. 2) and supplies the input data to the delay buffer 8 (S3 in FIG. 2). The control circuit 3 converts input data D1 into an absolute value (S4 in FIG. 2). The control circuit 3 filters input data D1 corresponding to a specified period and adds an offset (e.g., a specified value exceeding 0) (S5 in FIG. 2). The control circuit 3 compares the processing result at S5 with the absolute value conversion data (S6). The control circuit 3 performs the correction process similar to S106 described above (S8) if the processing result is smaller than the absolute value conversion data (S7: YES). The control circuit 3 proceeds to S9 if the processing result is greater than or equal to the absolute value conversion data (S7: NO).

At S9, the control circuit 3 determines whether power supply control start time Tstart is reached. After determining that power supply control start time Tstart is reached, the control circuit 3 starts the power supply control (S10). Until power supply control start time Tstart is reached, the control circuit 3 returns to S2 and repeats the process. After starting the power supply control, the control circuit 3 performs control to increase and decrease the power-supply voltage toward a command value (see voltage V2 in FIG. 6 as the principle diagram) of the power-supply voltage Vdd. The power supply control process continues (S11 in FIG. 2) after the control circuit 3 once starts the power supply control. After delay time Tdelay is reached (S12: YES), the control circuit 3 outputs the input data stored in the delay buffer 8 at a time point which is just the specified sampling interval after the time point stored in the delay buffer 8 (S13).

As the principle diagram in FIG. 6 illustrates, power-supply voltage Vdd is controlled to increase from initial voltage V1 to target voltage V2. As described at S109, power supply control start time Tstart is computed in advance by subtracting power supply transition time Tshift from delay time Tdelay so that the power supply control process starts without delay. Even if the amplitude suddenly increases after delay time Tdelay, power-supply voltage Vdd can be controlled to keep a voltage exceeding the amplitude. In the embodiment, the maximum value (maximum amplitude) of power-supply voltage Vdd is controlled. Alternatively, only the minimum value or the maximum value and the minimum value may be controlled.

Input data D1 of an audio signal is stored in the delay buffer 8 as needed, regardless of whether the amplitude increases or decreases. After the delay time Tdelay is reached, the control circuit 3 outputs input data D1 stored in the delay buffer 8. Then the control circuit 3 returns to S2 and repeats the process.

In the present embodiment, power supply transition time Tshift is set shorter than delay time Tdelay. During this redundant time, the control circuit 3 detects a sampling level of input data D1 of the audio signal and smoothes power-supply voltage Vdd in response to a change in battery voltage +VB. When outputting the input data from the delay buffer 8, the control circuit 3 controls power-supply voltage Vdd in conformity with the output data. Thus, the control circuit 3 can control and change power-supply voltage Vdd in conformity with the maximum efficiency of output from the power amplifier 11 without affecting the audio capability.

A maximum output value may be decreased according to the types of the signal sources 5, 9a through 9c. When the maximum output can be deceased (e.g., artificial indicator sound), the maximum value of power-supply voltage Vdd can be decreased. In this case, power supply transition time Tshift can be shortened to shorten delay time Tdelay.

For example, assume the signal sources 5, 9a through 9c to be AM or FM radio. In this case, the maximum power-supply voltage Vdd can be decreased to 9 [V] under the condition of 10 [W/ch] per channel as the maximum. The signal source may be used for an artificial indicator sound or a beep sound for alarm. In this case, the maximum power-supply voltage Vdd can be decreased to 6.5 [V] under the condition of 5 [W] as the maximum output.

According to the embodiment, as above, the control circuit 3 applies the absolute value process (S103, S4), the filter process (S104, S5), and the offset addition process (S104, S5) to an input sound signal. The control circuit 3 performs control to change voltage value of battery voltage +VB according to the types of the processed signal, the internal audio signal source 5, or the external audio signal sources 9a through 9c. The control circuit 3 can adjust the voltage to appropriate power-supply voltage Vdd according to the signal sources 5, 9a through 9c, save the power consumption, and improve the power efficiency of the battery power supply. The control circuit 3 delays the output of the sound signal stored in the delay buffer 8, only by the delay time Tdelay determined according to the time for the power supply control process. Therefore, the control circuit 3 can respond to a sudden change in the input signal and suppress a distortion.

The power supply transition time Tshift is set shorter than the delay time Tdelay. The control circuit 3 starts the power supply control just the power supply transition time Tshift before the time of outputting the sound signal following changing the internal or external audio signal source 5, 9a through 9c. Therefore, the control circuit 3 can perform power control without causing a clip as much as possible.

First control data D3 results from applying the absolute value process, the low-pass filter process, and the offset addition process to an input sound signal. Second control data D2 results from applying the absolute value process to the input sound signal. When first control data D3 is smaller than second control data D2, the control circuit 3 corrects first control data D3 within delay time Tdelay (including the delay time during the real-time process) so that first control data D3 is larger than or equal to second control data D2. Therefore, the control circuit 3 can control the power supply without causing a clip as much as possible.

Battery voltage +VB as a vehicular power supply may decrease to be smaller than a specified value for some reasons. In such a case, the control circuit 3 may perform control to decrease power-supply voltage Vdd while decreasing the maximum output of the power amplifier 11 as described above for example if a signal can be output without increasing the maximum output according to the types of the signal sources 5, 9a through 9c. This enables suppression of a sound distortion that results from insufficient power-supply voltage Vdd for the power amplifier 11. Furthermore, it becomes possible to save the power consumption, and improve the power efficiency of the battery power supply. This is particularly effective when the above-mentioned artificial indicator sound is selected from the signal sources 5 and 9a through 9c and a small maximum output suffices.

In the present embodiment, a first processing unit of the control circuit 3 performs the process at S103 and S4. A second processing unit of the control circuit 3 performs the process at S104 and S5. A power supply processing unit 7 performs the process at S105 and S11. A sound signal output unit of the control circuit 3 performs the process at S13. A correction unit of the control circuit 3 performs the process at S8. The first processing unit, the second processing unit, the power supply processing unit 7, the sound signal output unit, and the correction unit may be embodied as software or hardware.

(Second Embodiment)

Figure 7:
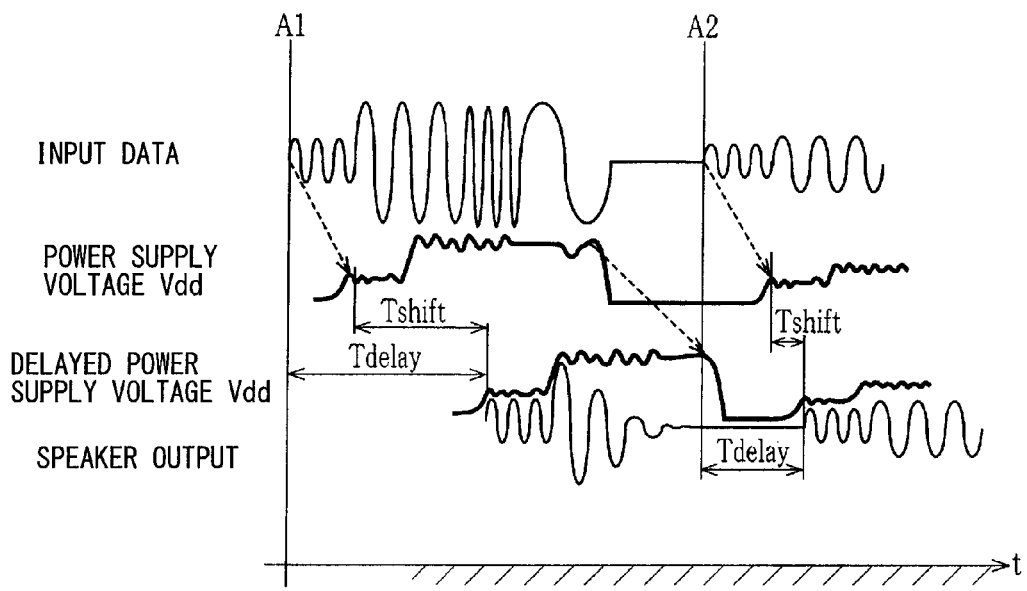
FIG. 7 is a waveform diagram schematically illustrating a flow of the power supply control process when a signal source is switched over according to a second embodiment of the present disclosure.

FIG. 7 illustrates the second embodiment. The second embodiment illustrates operations when the signal source is changed over. The description below is based on assumption that at time A1 in FIG. 7, a signal source is switched over to a first source of the internal audio signal source 5 and the external audio signal sources 9a through 9c, and then, at time A2 in FIG. 7, the signal source is switched over to a second source As illustrated in FIG. 7, when the signal source is switched over to the first source (e.g., terrestrial digital broadcasting) of the signal sources 5, 9a through 9c at time A1, the control circuit 3 performs the processes in FIGS. 2 and 3 in conformity with the first signal source. When the signal source is switched over to the second source (e.g., AM radio or artificial indicator sound) of the signal sources 5, 9a through 9c at time A2, the control circuit 3 mutes the signal output and changes the power supply fluctuation range to, for example, the minimum value. Such a parameter is changed each time the signal source 5, 9a through 9c is switched over. The control circuit 3 subsequently performs the control process in conformity with the parameter.

In the present embodiment, because the parameter can be changed in conformity with the signal source 5, 9a through 9c when the signal source is switched over, it is possible to provide control to change power-supply voltage Vdd for the power amplifier 11 in conformity with the signal sources 5, 9a through 9c. Therefore, it is possible to adjust the voltage to appropriate power-supply voltage Vdd in conformity with the signal sources and improve the power efficiency of battery power supply +VB.

Application, is for example, transmission of video and audio as compressed data in the terrestrial digital broadcasting. The vehicular audio-amplifier controller 1 acquires a decoded sound signal corresponding to the audio from the terrestrial digital broadcasting as the external audio signal source 9a through 9c.

Because sound signal decoding is completed faster than video decoding, a video signal causes a delay larger than the sound signal. Thus, a synchronization process is performed to simultaneously output the video and the audio. The decoded sound signal is delayed to synchronize with the video signal decoding.

Specifically, a decode process is applied to an MPEG2-TS signal after the MPEG2-TS signal is subject to a descramble process of a CAS system and divided into MPEG2-Video and MPEG2-AAC. In the decode process, a delay state difference between the video and the audio occurs as described above. The difference between the delay times can be used to concurrently perform the processes in FIGS. 2 and 3 on the audio signal only. Thus, the power supply control process can be completed at a time of finishing the video signal decoding. The delay in output of the video signal and the audio signal due to the power supply control process can be prevented.

The signal sources 5, 9a through 9c and so on such as terrestrial digital broadcasting, DVD, and CD require higher sound qualities than the AM radio. For such signal sources, the control circuit 3 may specify delay time Tdelay for each of the speakers 12a through 12d to adjust the time when sounds from the speakers 12a through 12d arrive at a targeted audience. In this case, the control circuit 3 performs the adjustment with reference to the distance to one of all the speakers 12a through 12d that is positioned farthest from the audience. This delay time Tdelay can be used to concurrently perform the above-mentioned processes on the sound signal only.

When the signal source 5, 9a through 9c is a warning tone, an artificial indicator sound or the like, it is required to avoid providing uncomfortable feeling. Thus, delay time Tdelay can be specified more freely than the above-mentioned example of application 1 or 2 in conformity with an in-vehicle system or vehicle installation requirements. On the other hand, an emergency alert prioritizes notification over acoustics, and delay time Tdelay is minimized.

(Other Embodiments)

The above-mentioned embodiments are not limiting and can be modified and extended for example as follows. Different delay times Tdelay may be specified for different signal sources 5, 9a through 9c (on an input port channel basis). Delay times Tdelay may be controlled individually or correlatively across several channels. Delay time Tdelay is not necessarily limited to the time required for the above-mentioned process. Delay time Tdelay may include, in addition to the process delay time for storing in the delay buffer 8 for audio replay, other intended times in an interval from the time of receipt of an instruction to change the signal sources 5, 9a through 9c to the time of actually output of a signal to the power amplifier 11.

When there is a sound signal (e.g., alarm or danger information) need to be preferentially notified in accordance with a vehicle system internal condition, the control circuit 3 may perform power control in accordance with information on the vehicle system. In this case, it may be preferable that the control circuit 3 preferentially shorten the delay time Tdelay and the power supply control time compared to the above-mentioned signal sources 5, 9a through 9c. This enables the information to be preferentially fast transmitted to users even if the sound quality degrades (clip).

The invention claimed is:

1. A vehicular audio-amplifier controller comprising:
a delay buffer that stores a sound signal supplied from a signal source;
a first processing unit that applies an absolute value process to the supplied sound signal;
a second processing unit that applies a low-pass filter process and an offset process to a processing result of the first processing unit;
a power supply controller that performs control to change a voltage value of a vehicular power supply at least in accordance with a signal value processed by the second processing unit and a type of the signal source; and
a sound signal output unit that outputs the sound signal stored in the delay buffer with only a delay time that is determined based on a power supply control process time of the power supply controller; wherein
the delay time is set appropriately according to the signal source.

2. A vehicular audio-amplifier controller comprising:
a delay buffer that stores a sound signal supplied from a signal source;
a first processing unit that applies an absolute value process to the supplied sound signal;
a second processing unit that applies a low-pass filter process and an offset process to a processing result of the first processing unit;
a power supply controller that performs control to change a voltage value of a vehicular power supply at least in accordance with a signal value processed by the second processing unit and a type of the signal source; and
a sound signal output unit that outputs the sound signal stored in the delay buffer with only a delay time that is determined based on a power supply control process time of the power supply controller; wherein
the power supply controller starts power supply control at a time point that is just a predetermined power supply transition time before a time point of outputting a sound signal from the sound signal output unit following a change in type of the signal source, and
the predetermined power supply transition time is shorter than the delay time.

3. A vehicular audio-amplifier controller comprising:
a delay buffer that stores a sound signal supplied from a signal source;
a first processing unit that applies an absolute value process to the supplied sound signal;
a second processing unit that applies a low-pass filter process and an offset process to a processing result of the first processing unit;
a power supply controller that performs control to change a voltage value of a vehicular power supply at least in accordance with a signal value processed by the second processing unit and a type of the signal source;
a sound signal output unit that outputs the sound signal stored in the delay buffer with only a delay time that is determined based on a power supply control process time of the power supply controller; and
a correction unit, wherein
when a processing result of the second processing unit is smaller than a processing result of the first processing unit, the correction unit corrects, within the delay time, the processing result of the second processing unit so as to be larger than or equal to the processing result of the first processing unit.

4. A vehicular audio-amplifier controller comprising:
a delay buffer that stores a sound signal supplied from a signal source;
a first processing unit that applies an absolute value process to the supplied sound signal;
a second processing unit that applies a low-pass filter process and an offset process to a processing result of the first processing unit;
a power supply controller that performs control to change a voltage value of a vehicular power supply at least in accordance with a signal value processed by the second processing unit and a type of the signal source; and
a sound signal output unit that outputs the sound signal stored in the delay buffer with only a delay time that is determined based on a power supply control process time of the power supply controller; wherein when a power supply transition time for power supply control performed by the power supply controller is greater than or equal to the delay time, the power supply controller performs the power supply control based on a maximum output from the signal source.

5. The vehicular audio-amplifier controller according to claim 1, wherein the delay time is set appropriately according to a type of the signal source.

\* \* \* \* \*